US009599725B2

(12) United States Patent
Luhta et al.

(10) Patent No.: US 9,599,725 B2
(45) Date of Patent: Mar. 21, 2017

(54) SPECTRAL IMAGING DETECTOR

(71) Applicant: KONINKLIJKE PHILIPS N.V., Eindhoven (NL)

(72) Inventors: Randall Peter Luhta, Chardon, OH (US); Rodney Arnold Mattson, Mentor, OH (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/014,297

(22) Filed: Feb. 3, 2016

(65) Prior Publication Data

US 2016/0154121 A1 Jun. 2, 2016

Related U.S. Application Data

(62) Division of application No. 14/006,703, filed as application No. PCT/IB2012/051300 on Mar. 19, 2012, now Pat. No. 9,281,422.

(Continued)

(51) Int. Cl.
*G01T 1/20* (2006.01)
*H01L 31/0232* (2014.01)
*G01T 1/29* (2006.01)

(52) U.S. Cl.
CPC .......... *G01T 1/2018* (2013.01); *G01T 1/2985* (2013.01); *H01L 31/02322* (2013.01)

(58) Field of Classification Search
CPC .......... H01L 31/02322; H01L 27/1446; H01L 31/18; H01L 27/1462; H01L 27/14603;

(Continued)

(56) References Cited

U.S. PATENT DOCUMENTS 5,043,582 A * 8/1991 Cox ................. G01T 1/2928
250/336.1
5,179,284 A * 1/1993 Kingsley ................. B29C 51/16
250/367

(Continued)

FOREIGN PATENT DOCUMENTS

EP 240249 1/2005
WO 2010/058335 5/2010

(Continued)

*Primary Examiner* — Jarrett Stark
*Assistant Examiner* — Bitew Dinke

(57) ABSTRACT

A method includes obtaining a photosensor substrate (236) having two opposing major surfaces. One of the two opposing major surfaces includes at least one photosensor row (230) of at least one photosensor element (232, 234), and the obtained photosensor substrate has a thickness equal to or greater than one hundred microns. The method further includes optically coupling a scintillator array (310) to the photosensor substrate. The scintillator array includes at least one complementary scintillator row (224) of at least one complementary scintillator element (226, 228), and the at least one complementary scintillator row is optically coupled to the at least one photosensor row (230) and the at least one complementary scintillator element is optically coupled to the at least one photosensor element. The method further includes thinning the photosensor substrate optically coupled to the scintillator producing a thinned photosensor substrate that is optically coupled to the scintillator and that has a thickness on the order of less than one hundred microns.

20 Claims, 7 Drawing Sheets

Related U.S. Application Data

(60) Provisional application No. 61/467,044, filed on Mar. 24, 2011.

(58) Field of Classification Search
CPC ....... G01T 1/2018; G01T 1/2985; G01T 1/00; G01T 1/161
See application file for complete search history.

(56) References Cited

U.S. PATENT DOCUMENTS

| | | | |
|---|---|---|---|
| 6,354,595 B1 * | 3/2002 | Vieux | H01L 27/14618 257/688 |
| 6,362,480 B1 | 3/2002 | Peter et al. | |
| 6,510,195 B1 | 1/2003 | Chappo et al. | |
| 7,692,156 B1 | 4/2010 | Nagarkar et al. | |
| 8,586,933 B2 | 11/2013 | Levene et al. | |
| 2002/0163993 A1 | 11/2002 | Hoffman et al. | |
| 2003/0169847 A1 * | 9/2003 | Karellas | A61B 6/481 378/98.3 |
| 2004/0256568 A1 * | 12/2004 | Sekine | G01T 1/2018 250/370.11 |
| 2005/0072931 A1 | 4/2005 | Abagli et al. | |
| 2005/0167603 A1 | 8/2005 | Hoffman | |
| 2007/0007461 A1 * | 1/2007 | Yanada | G01T 1/2018 250/370.11 |
| 2007/0057192 A1 * | 3/2007 | Vogtmeier | G01T 1/2018 250/370.11 |
| 2007/0085088 A1 | 4/2007 | Sekine et al. | |
| 2007/0235654 A1 | 10/2007 | Yahata | |
| 2008/0067392 A1 | 3/2008 | Miyaguchi | |
| 2008/0210877 A1 * | 9/2008 | Altman | A61B 6/032 250/366 |
| 2008/0253507 A1 * | 10/2008 | Levene | G01T 1/2018 378/19 |
| 2009/0121146 A1 | 5/2009 | Luhta et al. | |
| 2009/0140156 A1 | 6/2009 | Wittmann et al. | |
| 2009/0152447 A1 | 6/2009 | Yamada et al. | |
| 2009/0309036 A1 * | 12/2009 | Deliwala | H01L 27/1446 250/370.11 |
| 2010/0155606 A1 | 6/2010 | Kim et al. | |
| 2010/0200760 A1 * | 8/2010 | Baeumer | H01L 27/1446 250/366 |
| 2010/0220833 A1 | 9/2010 | Levene et al. | |
| 2010/0264322 A1 * | 10/2010 | Levene | G01T 1/202 250/367 |
| 2010/0276600 A1 | 11/2010 | Ronda et al. | |
| 2010/0308227 A1 | 12/2010 | Tonami et al. | |
| 2011/0056618 A1 | 3/2011 | Tonami et al. | |
| 2011/0113611 A1 | 5/2011 | Tonami et al. | |

FOREIGN PATENT DOCUMENTS

| | | | |
|---|---|---|---|
| WO | 2010058309 | 5/2010 | |
| WO | WO 2010058309 A2 * | 5/2010 | ............... G01T 1/00 |

* cited by examiner

SPECTRAL IMAGING DETECTOR

CROSS REFERENCE TO RELATED APPLICATIONS

This application is a divisional of U.S. patent application Ser. No. 14/006,703 filed Sep. 13, 2013, which is a national filing of PCT application Serial No. PCT/IB2012/051300, filed Mar. 19, 2012, published as WO 2012/127403 A2 on Sep. 27, 2012, which claims the benefit of U.S. Provisional application No. 61/467,044 filed Mar. 24, 2011, all of which are incorporated herein by reference.

FIELD OF THE INVENTION

The following generally relates to spectral imaging and more particularly to a spectral imaging detector, and is described in connection with computed tomography (CT). However, it is also amenable to other imaging modalities.

BACKGROUND OF THE INVENTION

A conventional computed tomography (CT) scanner includes a rotating gantry rotatably mounted to a generally stationary gantry. The rotating gantry supports an x-ray tube and a detector array, which is mounted on the rotatable gantry opposite the x-ray tube, across an examination region. The rotating gantry and hence the x-ray tube and the detector array rotate around the examination region about a longitudinal or z-axis. The x-ray tube is configured to emit radiation that traverses the examination region (and a portion of a subject or object in the examination region) and illuminates the detector array. The detector array detects the radiation and generates electrical signals indicative of the examination region and the subject or object disposed therein. A reconstructor reconstructs the projection data, generating volumetric image data.

For spectral CT, the scanner may include an energy-resolving detector array such as a double-decker detector array. An example portion of a double-decker detector array 100 is shown in FIG. 1. The detector 100 includes a plurality of detector modules 102 aligned with respect to each other along a substrate 104 in an x-direction 106. Each module 102 includes first and second scintillator rows 108 and 110 optically coupled to corresponding first and second detection regions 112 and 114 of a photodiode substrate 116. The first and second scintillator rows 108 and 110 are arranged with respect to each other such that the first scintillator row 108 is above the second scintillator element 110 with respect to the incoming radiation 120. Generally, lower energy x-rays photons tend to be absorbed in the upper scintillator row 108 and higher energy x-ray photons tend to be absorbed in the lower scintillator row 110. The first and second scintillator rows 108 and 110 and the detection regions 112 and 114 extend along a z-direction 122, forming multiple rows of detector elements.

With the detector array 100 of FIG. 1, the resolution of the detector array 100 in the x-direction 106 generally is limited by a finite thickness 124 of the photodiode substrate 116 of each module 102 in the x-direction 106, which has been on the order of one hundred (100) microns to four hundred (400) microns. Unfortunately, thinner photodiode substrates are fragile and not well-suited for constructing detector modules such as the detector modules 102 of the detector array 100.

SUMMARY OF THE INVENTION

Present aspects of the application provide new and/or improved techniques that address the above-referenced problems and others.

In accordance with one aspect, a method includes obtaining a photosensor substrate having two opposing major surfaces. One of the two opposing major surfaces includes at least one photosensor row of at least one photosensor element, and the obtained photosensor substrate has a thickness equal to or greater than one hundred microns. The method further includes optically coupling a scintillator array to the photosensor substrate. The scintillator array includes at least one complementary scintillator row of at least one complementary scintillator element, and the at least one complementary scintillator row is optically coupled to the at least one photosensor row and the at least one complementary scintillator element is optically coupled to the at least one photosensor element. The method further includes thinning the photosensor substrate optically coupled to the scintillator producing a thinned photosensor substrate that is optically coupled to the scintillator and that has a thickness on the order of less than one hundred microns.

According to another aspect, an imaging detector includes at least one detector tile including a tile substrate and a plurality of detector modules arranged along an x-direction along the tile substrate. A detector module includes a scintillator array having at least one scintillator row of scintillator elements extending along a z-direction coupled to at least one photosensor row of photosensor elements of a photosensor substrate. The photosensor substrate is coupled to the scintillator array and has an initial thickness that is equal to or greater than one hundred microns, and the photosensor substrate of the imaging detector has a thinned thickness of less than one hundred microns.

According to another aspect, a method includes assembling an imaging detector module of an imaging system, wherein the imaging detector module includes a scintillator optically coupled to a photosensor substrate, which has a thickness less than one hundred microns.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION OF EMBODIMENTS

Figure 2:
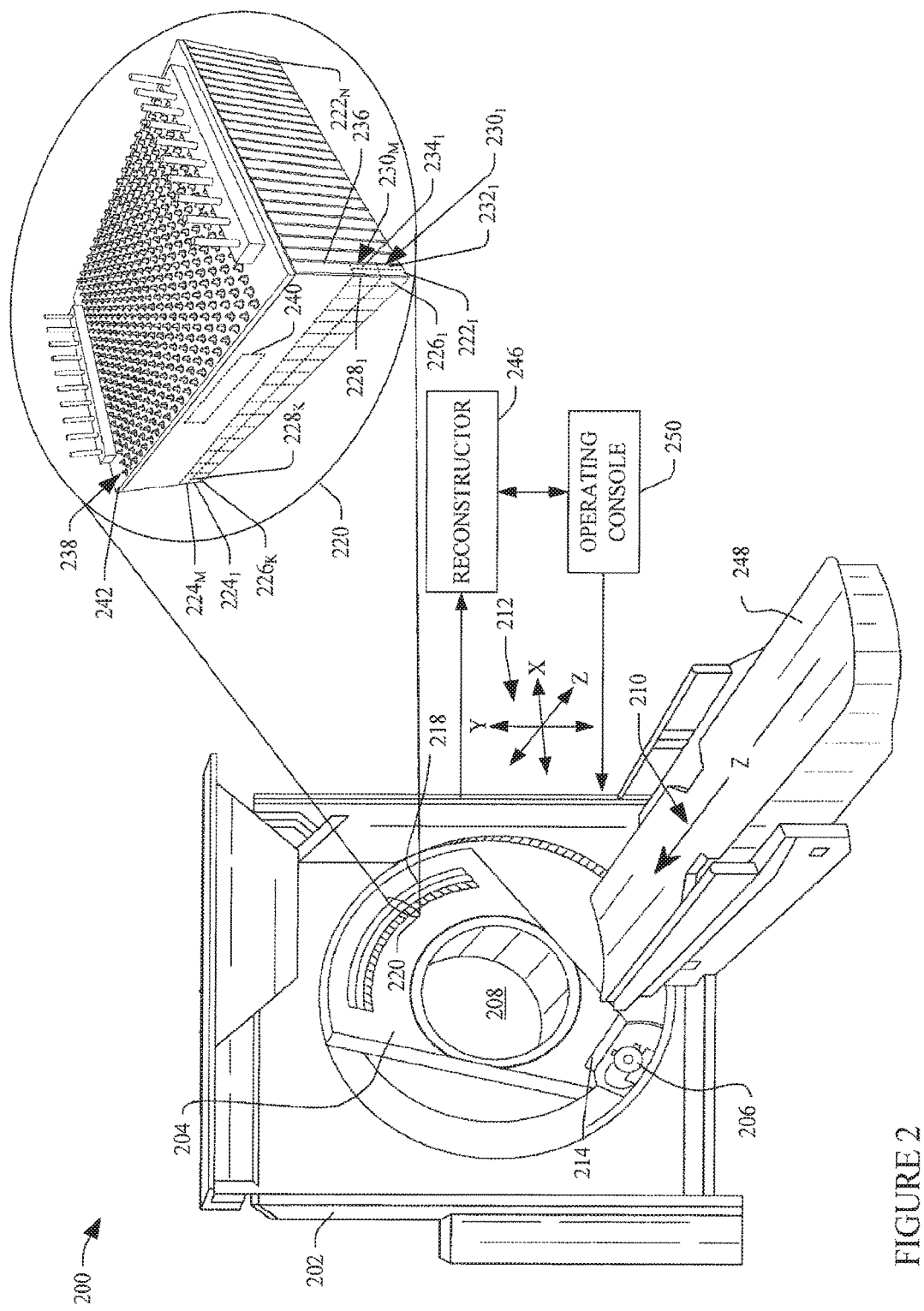
FIG. 2 schematically illustrates an example imaging system with a spectral detector array including a detector tile with a plurality of detector modules.

FIG. 2 schematically illustrates an imaging system 200 such as a computed tomography (CT) scanner. The imaging system 200 includes a generally stationary gantry portion 202 and a rotating gantry portion 204. The rotating gantry portion 204 is rotatably supported by the generally stationary gantry portion 202 via a bearing (not shown) or the like.

A radiation source 206, such as an x-ray tube, is supported by the rotating gantry portion 204 and rotates therewith around an examination region 208 about a longitudinal or z-axis 210 in connection with a frame of reference shown at 212. A source collimator 214 collimates radiation emitted by the radiation source 206, producing a generally cone, fan, wedge or otherwise-shaped radiation beam that traverse the examination region 208.

An energy-resolving detector array 218 subtends an angular arc opposite the examination region 208 relative to the radiation source 206 and detects radiation that traverses the examination region 208. The illustrated detector array 218 includes a plurality of tiles 220. Each tile 220 includes a plurality of detector modules $222_1, \ldots, 222_N$ (wherein N is an integer), arranged on a tile substrate 242, with respect to each other, along the x-direction. The plurality of detector modules $222_1, \ldots, 222_N$ are also referred to herein as detector modules 222.

Each detector module 222 includes a plurality of rows $224_1, \ldots, 224_M$ (wherein M is an integer equal to or greater than one, and collectively referred to as 224) of scintillator elements $226_1, \ldots, 226_K$ and $228_1, \ldots, 228_K$ (wherein K is an integer, and collectively referred to as 226 and 228) extending along the z-direction. In the illustrated embodiment, M=2, and the detector module is a spectral detector module. The rows of scintillator elements 226 and 228 are optically coupled to a corresponding plurality of rows $230_1, \ldots, 230_M$ (collectively referred to as 230) of photosensor elements $232_1, \ldots,$ and $234_1, \ldots$ (collectively referred to as 232 and 234) of a photosensor substrate 236 extending along the z-direction.

Each detector module 222 also includes electrically conductive pathways or pins 238. Where the detector module 222 further includes processing electronics 240 incorporated into the photosensor substrate 236 (as shown), the electrically conductive pathways or pins 238 are used to route power and digital signals from the processing electronics 240 to the tile substrate 242. Where the processing electronics 240 are located external to the photosensor substrate 236, the electrically conductive pathways or pins 238 are used to route signals from the photosensor elements 232 and 234 to the tile substrate 242

As described in greater detail below, the photosensor substrate 236, in one instance, has an x-axis thickness of less than one hundred (100) microns. With such a photosensor substrate, the detector array 218 can include more detector modules 222 for a given x-axis length relative to a configuration of the detector array with a thicker photosensor substrate (i.e., greater than 100 microns), and hence provide higher resolution in the x-direction. In one instance, such a detector array may include thirty (30) to sixty (60) percent more detector modules 222. Such a detector array may be considered a high definition detector array.

A reconstructor 246 reconstructs the signals generated by the detector array 218 and generates volumetric image data indicative of the examination region 208. Generally, the data from the different rows 230 of photosensor elements 232 and 234 can be individually processed for spectral information and/or combined (e.g., by summing the outputs of the different elements in the same ray path) to produce conventional non-spectral CT data.

A subject support 248 is configured to position the object or subject in the x, y, and/or z directions with respect to the examination region 208 before, during and/or after scanning the object or the subject.

A general purpose computing system serves as an operator console 250, and includes an output device such as a display, an input device such as a keyboard, mouse, and/or the like, one or more processor and computer readable storage medium (e.g., physical memory). The console 250 allows the operator to control operation of the system 200, for example, allowing the operator to select a spectral imaging protocol and/or spectral imaging reconstruction algorithm, initiate scanning, etc.

Figure 3:
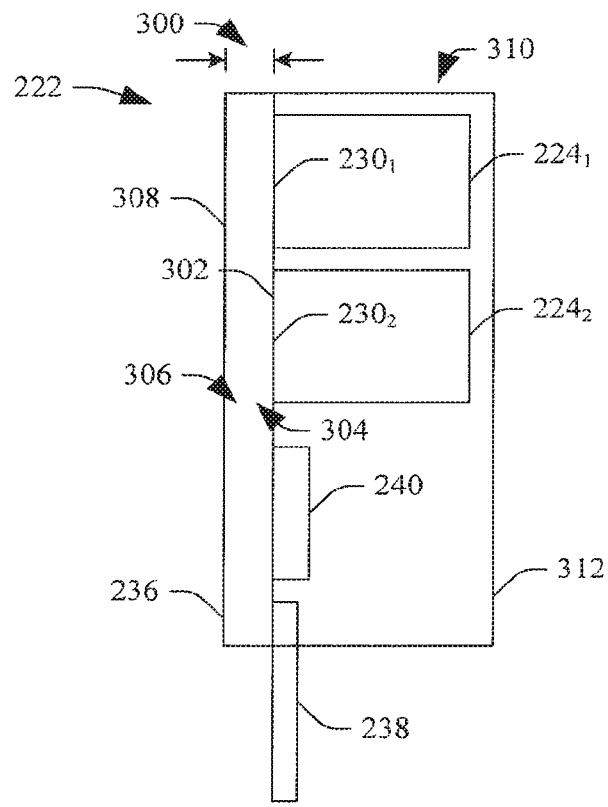
FIG. 3 schematically illustrates a side view of a detector module from the z-direction.
Figure 4:
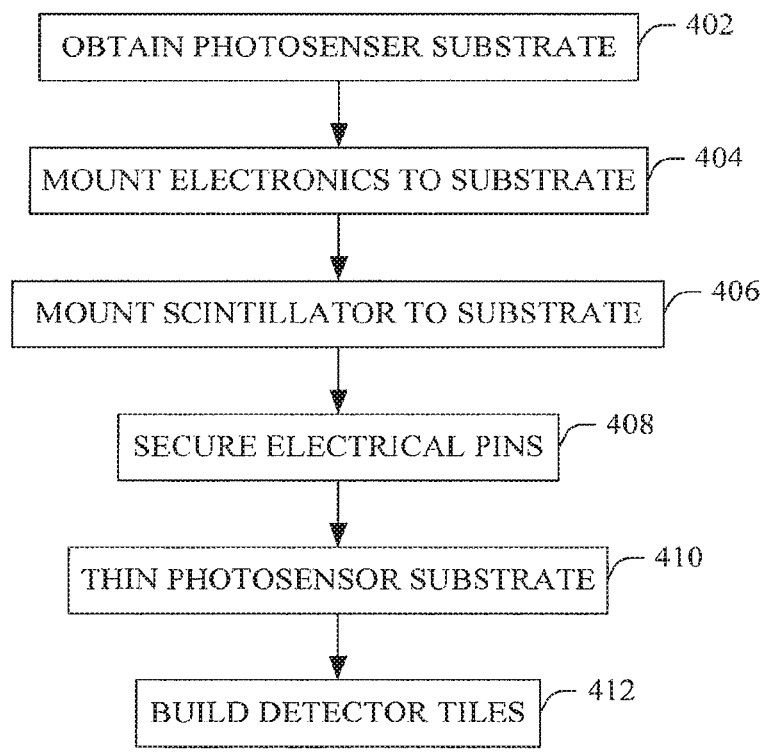
FIGS. 4-12 illustrate a method for assembling the detector module of FIG. 3.

FIG. 3 schematically illustrates a side view of a detector module 222 from the z-axis direction. For explanatory purposes, the detector module 222 is shown as having two scintillator rows $224_1$ and $224_2$ and two corresponding photosensor rows $230_1$ and $230_2$. However, as discussed above, the detector module 222 may have one or more of each of the scintillator rows 224 and the photosensor rows 224.

The detector module 222 includes the photosensor substrate 236. The illustrated photosensor substrate 236 has a thickness 300 on the order of fifty (50) microns (plus or minus a predetermined tolerance), such as a thickness value from a range of ten (10) to ninety (90) microns, twenty-five (25) to seventy-five (75) microns, forty (40) to sixty (60) microns, and/or other thickness value in one or more other ranges. A suitable material of the photosensor substrate 236 includes, but is not limited to silicon.

Figure 1:
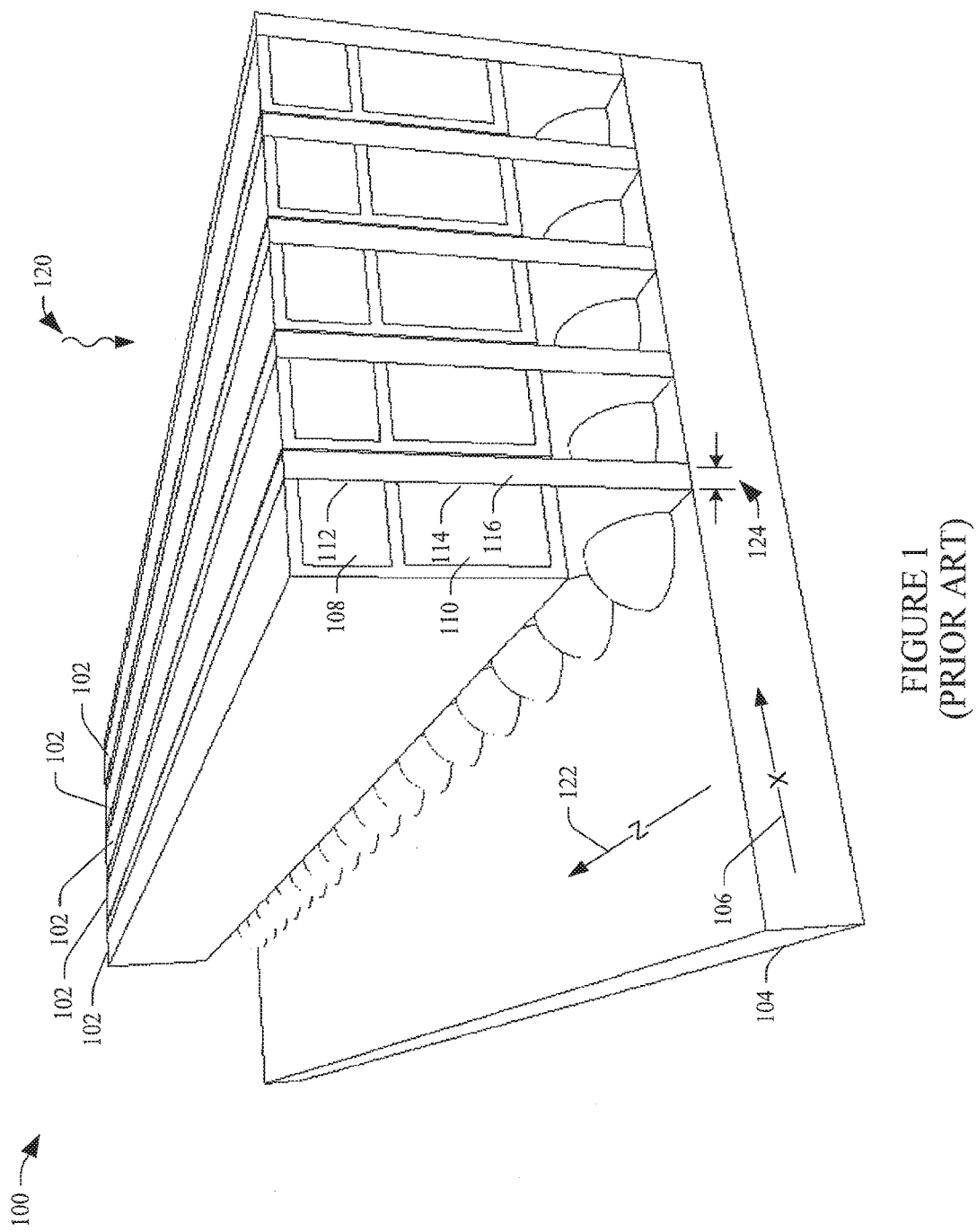
FIG. 1 schematically illustrates a perspective view of a prior art double-decker spectral detector array.

The photosensor substrate 236 includes a first major surface 302, with a first region 304 and a second region 306, and a second opposing major surface 308. The photosensor rows $230_1$ and $230_2$ are located in the first region 304 of the first major surface 302. The photosensor row $230_1$ is an upper row, which is closer to the radiation source 206 (FIG. 1) and hence the incoming radiation, and the photosensor row $230_2$ is a lower row, which is farther from the radiation source 206 (FIG. 1) and hence the incoming radiation.

The scintillator row $224_1$ is an upper scintillator element, which is closer to the radiation source 206 (FIG. 1) and hence the incoming radiation, and the scintillator row $224_2$ is a lower row, which is farther from the radiation source 206 (FIG. 1) and hence the incoming radiation. As discussed herein, the upper scintillator row $224_1$ is optically coupled to the corresponding upper photosensor row $230_1$ and the lower scintillator row $224_2$ is optically coupled to the corresponding lower photosensor row $230_2$.

In the illustrated embodiment, the upper and lower scintillator row $224_1$ and $224_2$ are rectangular shaped and are about equal in size. However, it is to be understood that other shapes and different sized scintillator row $224_1$ and $224_2$ are contemplated herein. Furthermore, spacing between the scintillator row $224_1$ and $224_2$ can be smaller or larger. Moreover, as the depths (and material) of the scintillator rows 224 can influence energy separation and/or x-ray statistics, the depths, generally, are such that the upper scintillator row $224_1$ is primarily responsive to lower energy photons and the lower scintillator row $224_2$ is primarily responsive to higher energy photons.

The photosensor substrate 236 optionally includes the processing electronics 240 (for processing signals from the photosensor elements 232 and 234) that are part of the photosensor substrate 236. As such, there will be fewer electrical pathways from the photosensor substrate 236 to the tile substrate 242, and z-axis widths of the photosensor elements 232 and 234 can be narrowed, increasing detector resolution in the z-direction. A non-limiting example of a photosensor substrate with processing electronics incorporated therein is described in patent application PCT/IB2009/054818, filed Oct. 29, 2009, and entitled "Spectral Imaging Detector" (WO/2010/058309), which is incorporated herein by reference in its entirety.

In the illustrated embodiment, the sides of the scintillator rows 224 not affixed to the substrate 236 are surrounded by reflective material 312, which extends over the entire first major surface 302. The combination of the scintillator rows 224 and the reflective material 312 is referred to herein as scintillator array 310. In another embodiment, the reflective material 312 can be omitted. In yet another embodiment, the reflective material 312 may only cover the first region 304.

FIGS. 4-12 describe an approach for assembling the detector array 218.

At 402, a photosensor substrate having a thickness of greater than one hundred (100) microns is obtained. For example, in one instance, the photosensor substrate 236 is obtained. An example of the substrate 236 is schematically illustrated in FIG. 5 and includes the two photosensor rows 232 and 234, a region 502 for the processing electronics 240, electrically conductive pads 504 for electrical components, and electrically conductive pads 506 for the electrically conductive pins 238.

Figure 5:
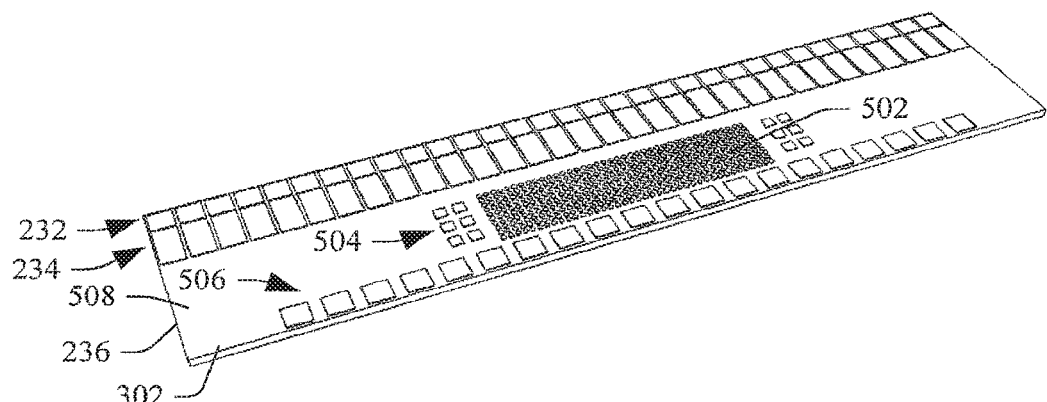
Figure 6:
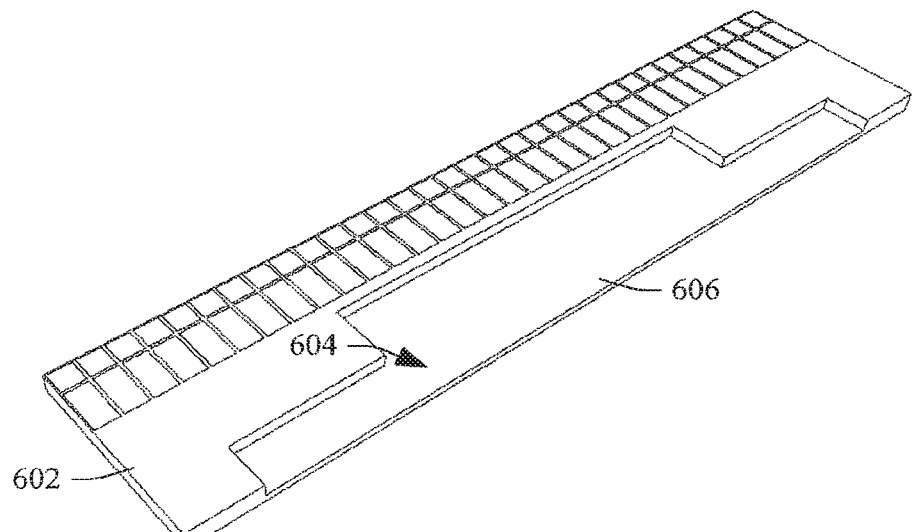

Note that in FIG. 5 the photosensor rows 232 and 234, the region 502 and the pads 504 and the pads 506 are on a same surface plane 508 of the first major surface 302 of the photosensor substrate 236. FIG. 6 schematically shows an embodiment in which the scintillator array 310 to be affixed to the photosensor substrate 236 includes a first surface 602 with a recess 604 and a second surface 606 in the recess 604 for the processing electronics 240, the electrical components, and the electrically conductive pins 238.

Figure 7:
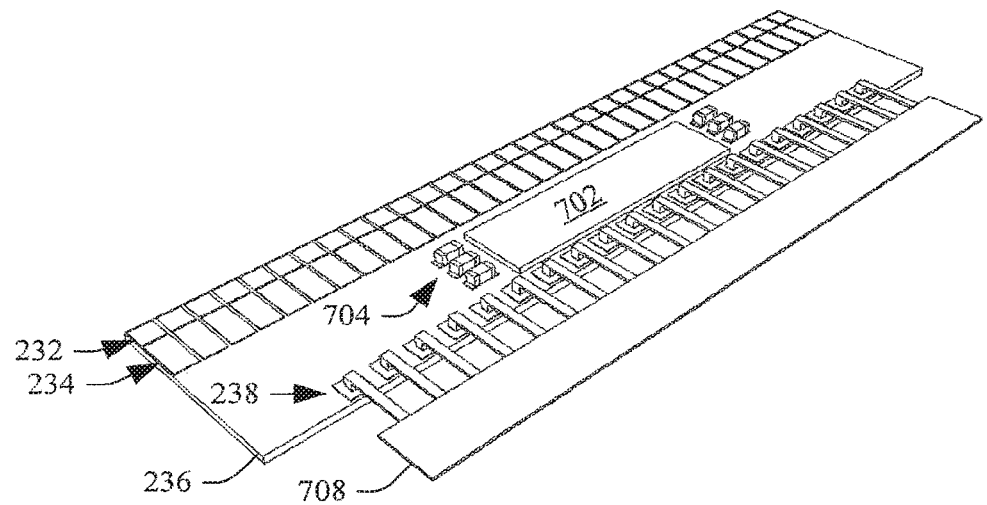

At 404, various electronics are mounted to the photosensor substrate. For example, and as schematically shown in FIG. 7, an integrated chip 702 (including the processing electronics 240 and/or other components) is mounted to the region 502, electrical components 704 (e.g., passive components) are mounted to the electrically conductive pads 504, and the electrically conductive pins 238 connected to a lead frame 708 are mounted to the electrically conductive pads 506.

Figure 8:
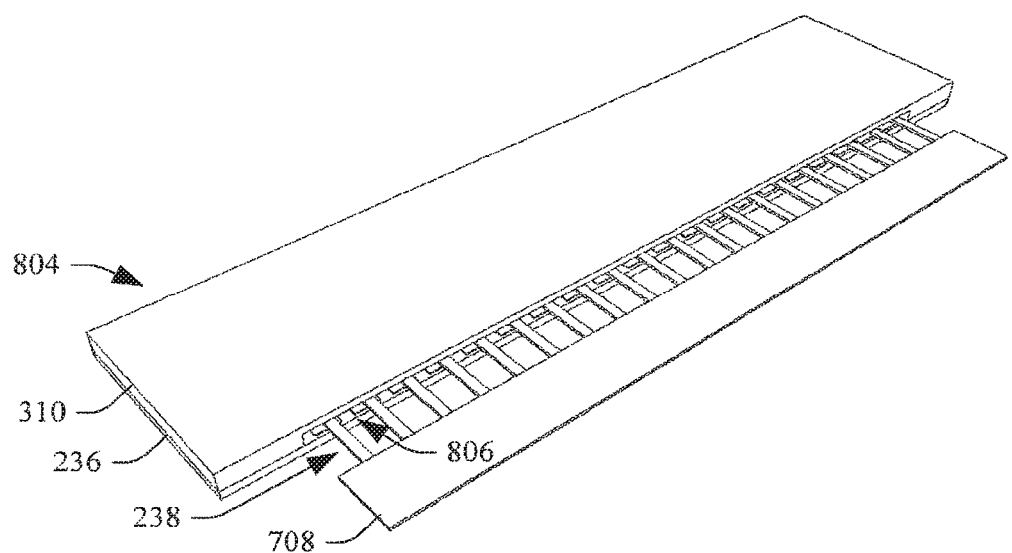

At 406, a scintillator is affixed to the photosensor substrate with the installed electronics, forming a scintillator-photosensor assembly. For example, FIG. 8 schematically shows the photosensor substrate 236 with the scintillator array 310 affixed thereto via an optical adhesive, forming a scintillator-photosensor assembly 804. Note that there are cavities 806 between the electrically conductive pins 238.

Figure 9:
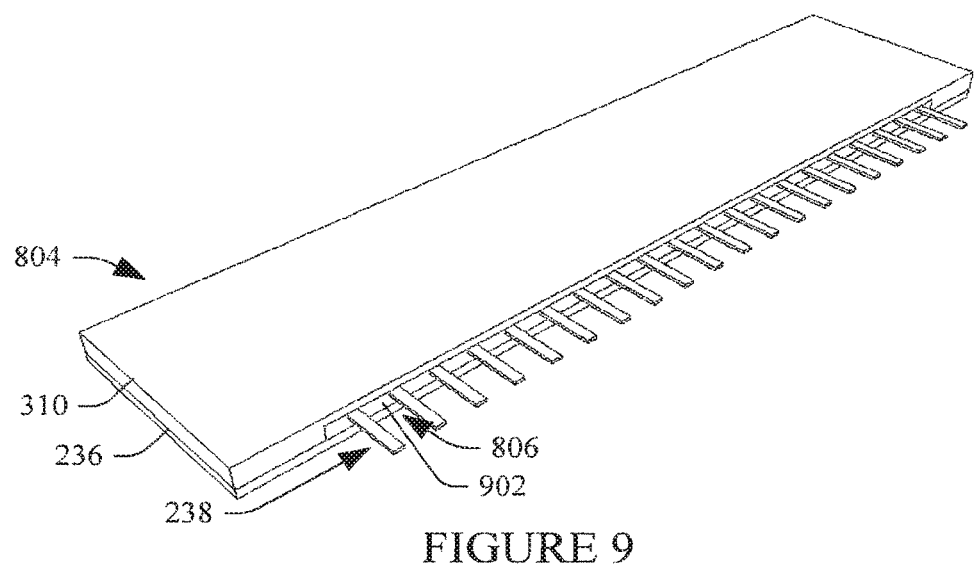

At 408, electrical pins mounted in act 404 above are secured in the scintillator—photosensor substrate assembly. For example, FIG. 9 schematically shows the scintillator—photosensor assembly 804 with adhesive 902 in cavities 806 between the electrically conductive pins 238. Note that the lead frame 708 has been removed from the scintillator—photosensor assembly 804.

Figure 10:
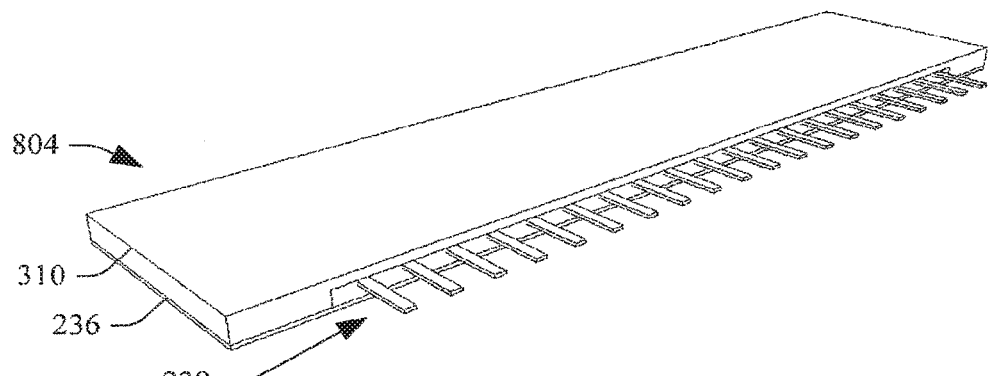
Figure 11:
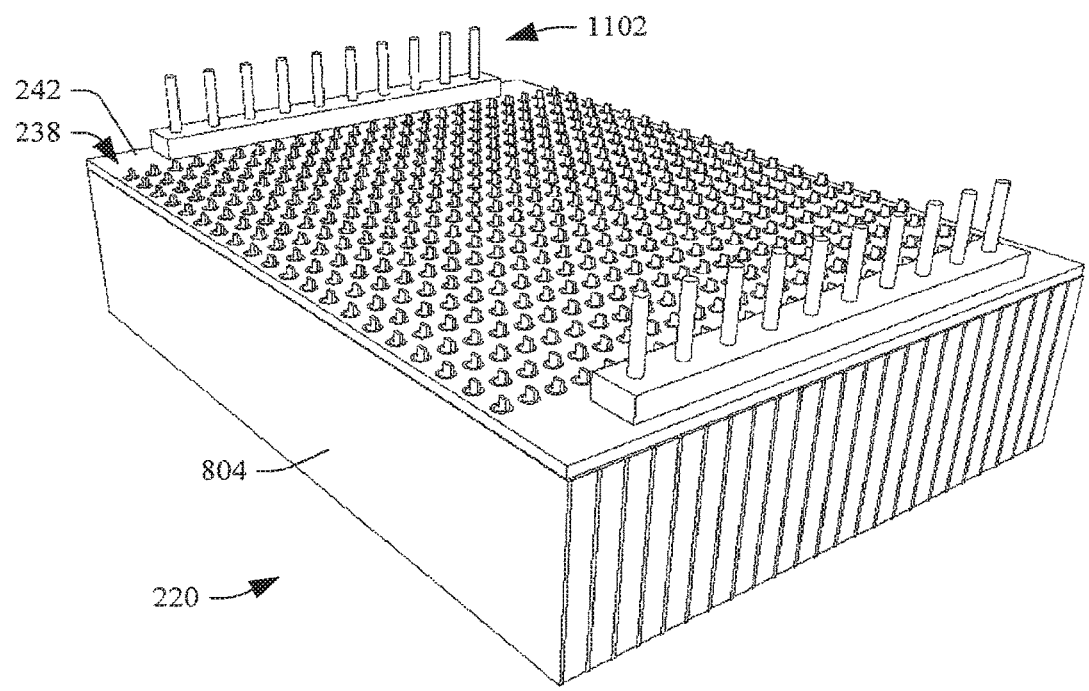
Figure 12:
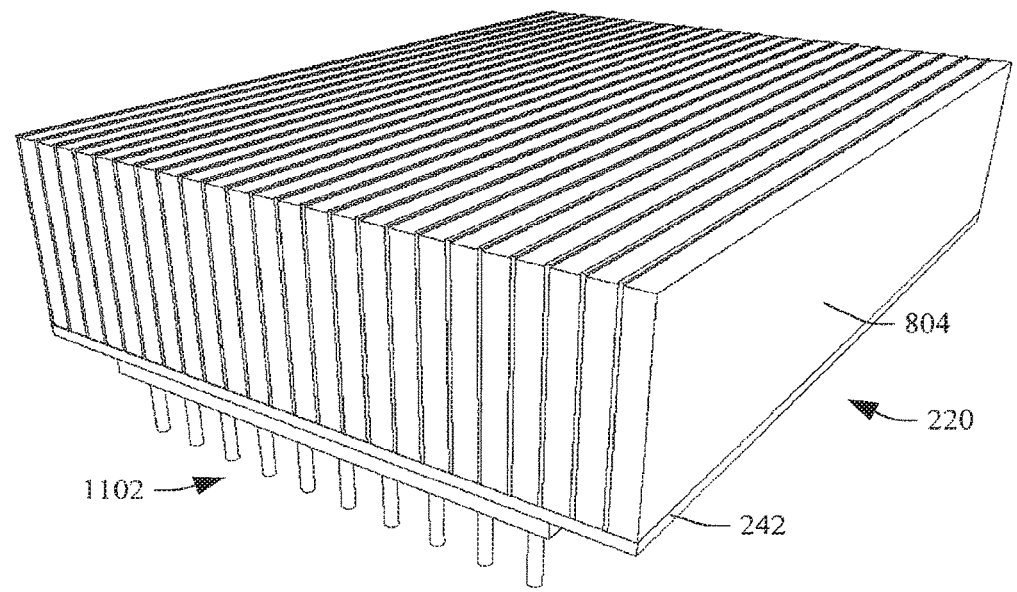

At 410, the photosensor substrate is thinned to a thickness of fifty (50) microns or less. For example, FIG. 10 schematically shows the scintillator—photosensor assembly 804 with a thinned photosensor substrate 236 having a thickness of fifty (50) microns or less. In one instance, the photosensor substrate 236 can be thinned via grinding. Other thinner techniques are also contemplated herein.

At 412, a detector tile is created from a plurality of the scintillator—photosensor assemblies 804. For example, FIGS. 11 and 12 respectively show bottom and top perspective views in which a plurality of the scintillator—photosensor assemblies 804 are physically and electrically connected to the tile substrate 242 via the pins 238 forming the tile 220. Note the tile substrate 242 also includes electrically conductive pins 1102 for the physically and electrically connecting the tile 220 to the detector array 218.

It is to be appreciated that the ordering of the above acts is not limiting. As such, other orderings are contemplated herein. In addition, one or more acts may be omitted and/or one or more additional acts may be included, and/or one or more acts may occur concurrently.

Figure 13:
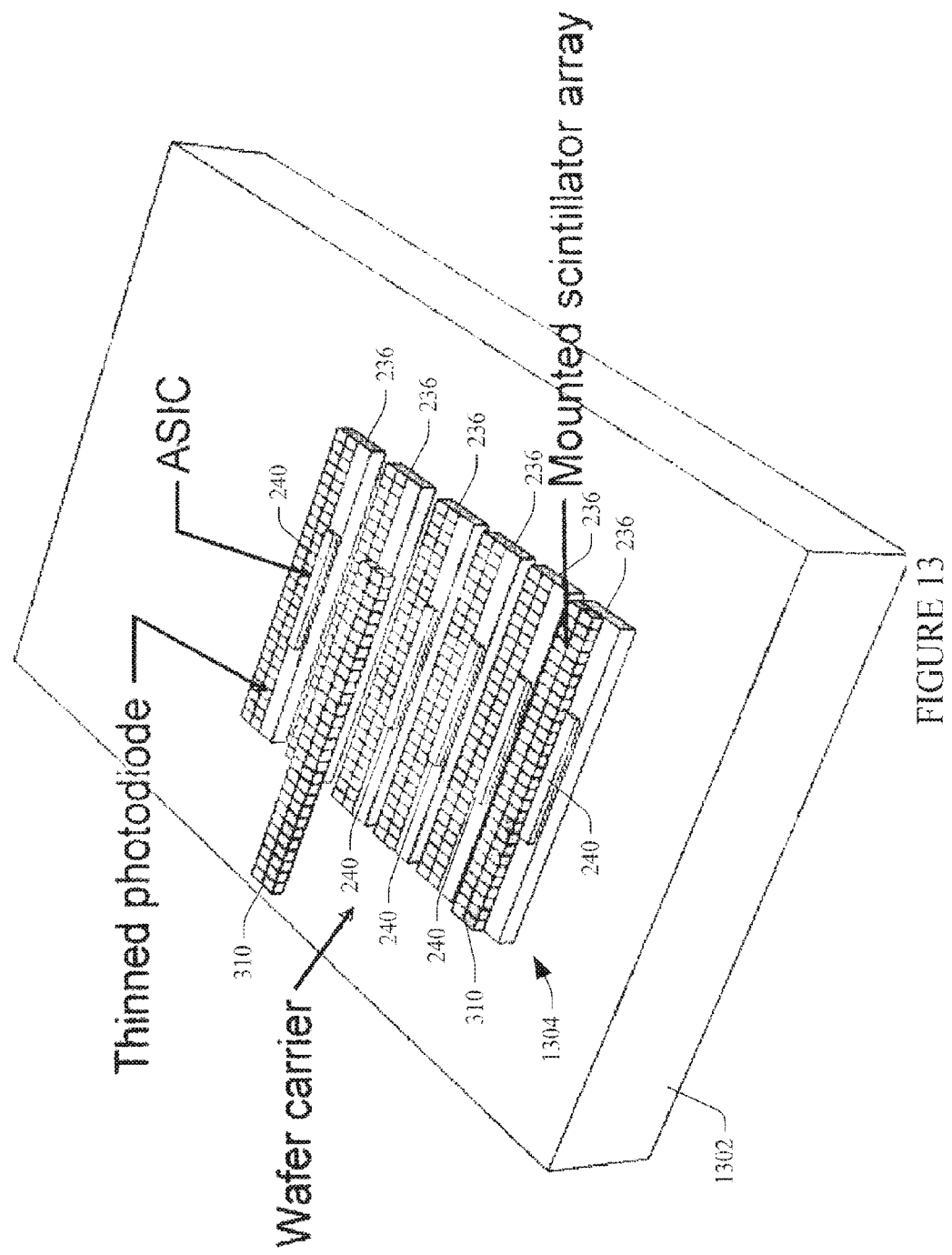
FIG. 13 illustrates an embodiment in which a support carrier is utilized to facilitate making the individual photosensor substrates.

FIG. 13 illustrates an embodiment in which a support carrier 1302 is utilized to facilitate making the individual substrates 236. In one instance, a sheet 1304 of material including a plurality of substrates 236 is processed and thinned, for example, to a thickness of less than one hundred microns. The sheet 1304 is then transferred to the support carrier 1302. The processing electronics 240 are mounted to the plurality of substrates 236. The individual substrates 236 are then cut from the sheet using a laser, mechanical saw, etc. and left on the carrier 1302. A vacuum chuck feature of the carrier is activated after the individual substrates 236 are cut. The scintillator array 310 is then optically coupled to the bonded to the individual substrates 236 and cured. The resulting assemblies can then be further processed as described herein.

Variations are contemplated.

In another embodiment, the processing electronics 240 are located external to the photosensor substrate 236.

In another embodiment, the module 222 includes a single scintillator row optically couple to a single photosensor row.

Additionally or alternatively, in yet another instance, each scintillator row and each photosensor row respectively includes a single scintillator element and a single photosensor element.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

What is claimed is:

1. An imaging detector, comprising:
   a photosensor substrate including two opposing major surfaces, wherein one of the two opposing major surfaces is perpendicular to a radiation receiving surface of the imaging detector and includes a plurality of photosensor rows of a plurality of photosensor elements, and the photosensor substrate has a thinned thickness on an order of less than one hundred microns; and
   a scintillator array optically coupled to the photosensor substrate, wherein the scintillator array includes a plurality of complementary scintillator rows of a plurality of complementary scintillator elements, the scintillator array includes two major opposing surfaces, which are perpendicular to the radiation receiving surface, with a recess in one of the two major surfaces, separate from the complementary scintillator elements, which couples to the photosensor substrate.

2. The imaging detector of claim 1, wherein each of the plurality of complementary scintillator rows is optically coupled to one of the plurality of photosensor rows, and each of the plurality of complementary scintillator elements is optically coupled to one of the plurality of photosensor elements.

3. The imaging detector of claim 1, wherein the photosensor substrate has an original thickness equal to or greater than one hundred microns.

4. The imaging detector of claim 3, wherein the original thickness corresponds to a thickness of the photosensor substrate before the photosensor substrate is optically coupled to the scintillator array.

5. The imaging detector of claim 4, wherein the original thickness corresponds to a thickness of the photosensor substrate after the photosensor substrate is optically coupled to the scintillator array.

6. The imaging detector of claim 5, wherein the thinned thickness corresponds to a thickness of the photosensor substrate after the photosensor substrate optically coupled to the scintillator array it thinned.

7. The imaging detector of claim 1, further comprising:
processing electronics disposed between the photosensor substrate and the scintillator array within the recess.

8. The imaging detector of claim 7, wherein at least one of the plurality of photosensor rows and the processing electronics are disposed on a same surface of the photosensor substrate.

9. The imaging detector of claim 1, wherein the recess includes surfaces of at least three sides and an opening surface of other major surface of the scintillator array.

10. The imaging detector of claim 1, further comprising:
electrically conductive pins disposed between the photosensor substrate and the scintillator array.

11. The imaging detector of claim 10, wherein at least one of the plurality of photosensor rows and the electrically conductive pins are disposed on a same surface of the photosensor substrate.

12. The imaging detector of claim 10, wherein the electrically conductive pins are disposed on a surface in the recess of the scintillator array.

13. The imaging detector of claim 1, wherein at least one of the plurality of photosensor elements is electrically coupled to processing electronics located external to the photosensor substrate.

14. The imaging detector of claim 1, further comprising:
a detector tile, including a plurality of the thinned photosensor substrates mechanically and electrically coupled to a detector tile substrate, wherein the detector tile includes a major surface that is a surface of the detector tile receiving radiation and the surface of the detector tile receiving radiation is perpendicular to the major surfaces of the scintillator array and the photosensor substrate.

15. The imaging detector of claim 14, further comprising:
a detector array, including a plurality of the detector tiles mechanically and electrically coupled together.

16. The imaging detector of claim 1, wherein the thickness of the thinned photosensor substrate is in a range from twenty-five to seventy-five microns.

17. The imaging detector of claim 1, wherein the thickness of the thinned photosensor substrate is on the order of fifty microns.

18. The imaging detector of claim 1, wherein the elements of the plurality of photosensor elements are spectral photosensor elements.

19. The imaging detector of claim 1, further comprising:
processing electronics, wherein the processing electronics are incorporated into the photosensor substrate.

20. An imaging system, comprising:
a radiation source that generates and transmits radiation;
an imaging detector that receives radiation transmitted by the radiation source and generates a signal indicative thereof, the imaging detector, including:
a photosensor substrate including two opposing major surfaces, wherein one of the two opposing major surfaces is perpendicular to a radiation receiving surface of the imaging detector and includes a plurality of photosensor rows of a plurality of photosensor elements, and the photosensor substrate has a thinned thickness on an order of less than one hundred microns; and
a scintillator array optically coupled to the photosensor substrate, wherein the scintillator array includes a plurality of complementary scintillator rows of a plurality of complementary scintillator elements, the scintillator array includes two major opposing surfaces, which are perpendicular to the radiation receiving surface, with a recess in one of the two major surfaces separate from the complementary scintillator elements which couples to the photosensor substrate; and
a reconstructor that reconstructs the signal, generating an image.

* * * * *